US008759868B2

(12) United States Patent
Raffetto et al.

(10) Patent No.: US 8,759,868 B2
(45) Date of Patent: Jun. 24, 2014

(54) ULTRA-THIN OHMIC CONTACTS FOR P-TYPE NITRIDE LIGHT EMITTING DEVICES

(75) Inventors: Mark Raffetto, Santa Barbara, CA (US); Jayesh Bharathan, Cary, NC (US); Kevin Haberern, Cary, NC (US); Michael Bergmann, Chapel Hill, NC (US); David Emerson, Chapel Hill, NC (US); James Ibbetson, Santa Barbara, CA (US); Ting Li, Ventura, CA (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/271,865

(22) Filed: Oct. 12, 2011

(65) Prior Publication Data

US 2012/0080688 A1 Apr. 5, 2012

Related U.S. Application Data

(62) Division of application No. 11/191,111, filed on Jul. 27, 2005, now Pat. No. 8,089,090.

(60) Provisional application No. 60/591,353, filed on Jul. 27, 2004, provisional application No. 60/639,705, filed on Dec. 28, 2004.

(51) Int. Cl.

*H01L 29/22* (2006.01)
*H01L 33/42* (2010.01)
*H01L 33/40* (2010.01)
*H01L 33/32* (2010.01)
*H01L 33/38* (2010.01)

(52) U.S. Cl.

CPC ................ *H01L 33/42* (2013.01); *H01L 33/32* (2013.01); *H01L 2933/0016* (2013.01); *H01L 33/38* (2013.01); *H01L 33/40* (2013.01); *H01L 33/405* (2013.01)

USPC .............................. 257/99; 257/744; 257/745

(58) Field of Classification Search

USPC ................ 257/79, 81, 99, 183, 734, 754–745

See application file for complete search history.

(56) References Cited

U.S. PATENT DOCUMENTS 4,918,497 A 4/1990 Edmond
4,966,862 A 10/1990 Edmond (Continued)

FOREIGN PATENT DOCUMENTS

CN 1102507 A 5/1995
CN 1213863 A 4/1999

(Continued)

OTHER PUBLICATIONS

Jaeger *Introduction to Microelectronic Fabrication* 2nd Edition, Chapter 6 (2002).

(Continued)

*Primary Examiner* — Matthew E Warren
(74) *Attorney, Agent, or Firm* — Myers Bigel Sibley & Sajovec, P.A.

(57) ABSTRACT

A flip-chip semiconductor based Light Emitting Device (LED) can include an n-type semiconductor substrate and an n-type GaN epi-layer on the substrate. A p-type GaN epi-layer can be on the n-type GaN epi-layer and a metal ohmic contact p-electrode can be on the p-type GaN epi-layer, where the metal ohmic contact p-electrode can have an average thickness less than about 25 Å. A reflector can be on the metal ohmic contact p-electrode and a metal stack can be on the reflector. An n-electrode can be on the substrate opposite the n-type GaN epi-layer and a bonding pad can be on the n-electrode.

16 Claims, 11 Drawing Sheets

(56) References Cited

U.S. PATENT DOCUMENTS

| | | | |
|---|---|---|---|
| 5,027,168 A | 6/1991 | Edmond | |
| 5,210,051 A | 5/1993 | Carter | |
| 5,338,944 A | 8/1994 | Edmond et al. | |
| 5,393,993 A | 2/1995 | Edmond et al. | |
| 5,416,342 A | 5/1995 | Edmond et al. | |
| 5,523,589 A | 6/1996 | Edmond et al. | |
| 5,604,135 A | 2/1997 | Edmond | |
| 5,631,190 A | 5/1997 | Negley | |
| 5,739,554 A | 4/1998 | Edmond et al. | |
| 5,912,477 A | 6/1999 | Negley | |
| 6,120,600 A | 9/2000 | Edmond et al. | |
| 6,187,606 B1 | 2/2001 | Edmond et al. | |
| 6,201,262 B1 | 3/2001 | Edmond et al. | |
| 6,521,999 B1 | 2/2003 | Uemura et al. | |
| 6,664,560 B2 | 12/2003 | Emerson et al. | |
| 6,734,033 B2 | 5/2004 | Emerson et al. | |
| 6,740,906 B2 | 5/2004 | Slater, Jr. et al. | |
| 6,791,119 B2 | 9/2004 | Slater, Jr. et al. | |
| 7,265,392 B2 | 9/2007 | Hahn et al. | |
| 2002/0117672 A1 | 8/2002 | Chu et al. | |
| 2003/0006418 A1 | 1/2003 | Emerson et al. | |
| 2003/0006422 A1 | 1/2003 | Miki et al. | |
| 2003/0045960 A1 | 3/2003 | Yamamoto et al. | |
| 2003/0122144 A1 | 7/2003 | Uemura et al. | |
| 2003/0123164 A1 | 7/2003 | Hsu et al. | |
| 2003/0168663 A1 | 9/2003 | Slater et al. | |
| 2003/0168664 A1 | 9/2003 | Hahn et al. | |
| 2003/0209720 A1 | 11/2003 | Okazaki et al. | |
| 2004/0206977 A1 | 10/2004 | Cho et al. | |
| 2005/0230701 A1 | 10/2005 | Huang | |
| 2007/0178689 A1 | 8/2007 | Nakamura et al. | |
| 2008/0048172 A1 | 2/2008 | Muraki et al. | |
| 2009/0263922 A1* | 10/2009 | Kamei | 438/29 |

FOREIGN PATENT DOCUMENTS

| | | | |
|---|---|---|---|
| CN | 200910175001.9 | | 4/1999 |
| CN | 1046375 | C | 11/1999 |
| CN | 1368764 | A | 9/2002 |
| CN | 1540774 | A | 10/2004 |
| EP | 0 622 858 | A2 | 11/1994 |
| JP | 02-124406 | A | 5/1990 |
| JP | 4-343220 | A | 11/1992 |
| JP | 05-080203 | A | 4/1993 |
| JP | H05-325900 | A | 12/1993 |
| JP | H06-268253 | A | 9/1994 |
| JP | 8335717 | | 12/1996 |
| JP | H10-151696 | A | 6/1998 |
| JP | 2000-036619 | | 2/2000 |
| JP | 2000-252230 | A | 9/2000 |
| JP | 2000244010 | | 9/2000 |
| JP | 2001-196631 | A | 7/2001 |
| JP | 2002-170988 | A | 6/2002 |
| JP | 2002-231997 | A | 8/2002 |
| JP | 2002359396 | | 12/2002 |
| JP | 2003-179301 | A | 6/2003 |
| JP | 2003-534668 | A | 11/2003 |
| JP | 2004-63732 | A | 2/2004 |
| JP | 2004-063732 | A | 2/2004 |
| JP | 2004-363621 | A | 12/2004 |
| JP | 2005-117020 | A | 4/2005 |
| JP | 2005117020 | | 4/2005 |
| JP | 2005-197687 | A | 7/2005 |
| KR | 10-2003-0019266 | | 3/2003 |

OTHER PUBLICATIONS

U.S. Appl. No. 10/881,814 entitled "Light Emitting Devices Having Current Blocking Structures and Methods of Fabricating Light Emitting Devices Having Current Blocking Structures" filed Jun. 30, 2004.

U.S. Appl. No. 10/899,791 entitled "Group III Nitride Based Quantum Well Light Emitting Device Structures with an Indium Containing Capping Structure" filed Jul. 27, 2004.

U.S. Appl. No. 10/899,793 entitled "Light Emitting Devices Having a Reflective Bond Pad and Methods of Fabricating Light Emitting Devices having a Reflective Bond Pad" filed Jul. 27, 2004.

U.S. Appl. No. 60/591,353 entitled "Ultra-Thin Ohmic Contacts for P-Type Nitride Light Emitting Devices" filed Jul. 27, 2004.

U.S. Appl. No. 60/639,705 entitled "Ultra-Thin Ohmic Contacts for P-Type Nitride Light Emitting Devices" filed Dec. 28, 2004.

International Search Report and Written Opinion of the International Searching Authority for International Patent Application No. PCT/US2005/026558 mailed on Mar. 29, 2006.

English Translation of the First Office Action (8 pages) corresponding to Chinese Patent Application No. 200580025279.8 (PCT/US2005/026558) issued on Aug. 8, 2008.

Second Chinese Office Action (1 page) corresponding to Chinese Patent Application No. 200580025279.8; Mailing Date: Mar. 20, 2009.

English Translation of the First Office Action corresponding to Chinese Patent Application No. 200910175001.9; Mailing Date: Nov. 15, 2010.

Notification of an Office Action issued in the corresponding Japanese Patent Application No. 2007-523744; Mailing Date: Apr. 20, 2011.

International Preliminary Report on Patentability Corresponding to International Application No. PCT/US2005/026558; Date of Mailing: Nov. 10, 2006; 11 pages.

Fourth Office Action, corresponding to Chinese Patent Application No. 200910175001.9; Date of Mailing: Nov. 1, 2012; 5 pages.

Japanese Office Action; Mail Date Dec. 21, 2012; Japanese Patent Application No. 2007-523744 (4 pages).

Annapragada et al. "Determination of Electrical Contact Resistivity in Thermoelectric Modules (TEMs) from Module-Level Measurements", *IEEE Transactions on Components, Packaging and Manufacturing Technology*, vol. 2, No. 4, 668-676, Apr. 2012.

Compound Semiconductor, "Osram Enhances Brightness of Blue InGaN LEDs", vol. 7, No. 1, Feb. 2001, p. 7.

Japanese Office Action, JP App. No. 2011-227824, Feb. 28, 2014.

Japanese Office Action, JP App. No. 2011-227831, Feb. 24, 2014.

* cited by examiner

ULTRA-THIN OHMIC CONTACTS FOR P-TYPE NITRIDE LIGHT EMITTING DEVICES

CLAIM OF PRIORITY AND CROSS-REFERENCE TO RELATED APPLICATIONS

The present application is a divisional of U.S. patent application Ser. No. 11/191,111, filed Jul. 27, 2005 now U.S. Pat. No. 8,089,090; and is related to U.S. Provisional Patent Application No. 60/591,353; Filed Jul. 27, 2004 entitled Ultra-Thin Ohmic Contacts for P-Type Nitride Light Emitting Devices by Raffetto et al. and to U.S. Provisional Patent Application No. 60/639,705; Filed Dec. 28, 2004 entitled Ultra-Thin Ohmic Contacts for P-Type Nitride Light Emitting Devices by Raffetto, now U.S. Pat. No. 8,044,425 issued on Oct. 25, 2011, the disclosures of all of which are hereby incorporated herein by reference in their entireties.

STATEMENT OF GOVERNMENT SUPPORT

This Invention was made with Government support under grant number DE-FC26-00NT40985 from the Department Of Energy. The Government has certain rights to this invention.

FIELD OF THE INVENTION

The present invention relates to semiconductor devices, and more particularly to light emitting devices having an ohmic contact formed on a Group III nitride-based epitaxial layer.

BACKGROUND

Light emitting diodes and laser diodes are well known solid state electronic devices capable of generating light upon application of a sufficient voltage. Light emitting diodes and laser diodes may be generally referred to as light emitting devices (LEDs). Light emitting devices generally comprise a p-n junction formed in an epitaxial layer grown on a substrate such as sapphire, silicon, silicon carbide, gallium arsenide and the like. The wavelength distribution of the light generated by the LED depends on the material from which the p-n junction is fabricated and the structure of the thin epitaxial layers that comprise the active region of the device.

Typically, an LED includes an n-type substrate, an n-type epitaxial region formed on the substrate and a p-type epitaxial region formed on the n-type epitaxial region. In order to facilitate the application of a voltage to the device, an anode ohmic contact is formed on a p-type region of the device (typically, an exposed p-type epitaxial layer) and a cathode ohmic contact is formed on an n-type region of the device (such as the substrate or an exposed n-type epitaxial layer).

Because it may be difficult to make highly conductive p-type Group III-nitride materials (such as GaN, AlGaN, InGaN, AlInGaN, and AlInN), lack of current spreading in the p-type layer may be a limiting factor in the performance of LEDs formed from such materials. Accordingly, it may be desirable to form an ohmic contact over as much of the surface area of the exposed p-type layer as possible in order to induce current to pass through as much of the active region of the device as possible. However, providing a large anode contact may be detrimental to device performance in some respects. It is typically desirable to extract as much light as possible out of a light emitting diode. Since the anode ohmic contact generally comprises a metal layer, light generated in the active region of the LED may be partially absorbed in the ohmic contact, reducing the overall luminescent efficiency of the device.

In some devices, it may be desirable to form a reflective metal layer over the exposed p-type layer, so that light that would normally exit the device through the p-type layer is reflected back into the device to be extracted through the substrate. However, highly reflective metals such as aluminum and silver do not form good ohmic contacts to p-type nitride materials. Thus, an ohmic contact is typically provided between the p-type nitride layer and the reflector. Reducing absorption in the ohmic contact remains a concern in such devices.

Accordingly, there is a need for improved ohmic contact structures and methods of forming ohmic contact structures on p-type nitride materials.

SUMMARY

Embodiments according to the invention can provide ultra-thin ohmic contacts for p-type nitride light emitting devices and methods of forming. Pursuant to these embodiments, a semiconductor based Light Emitting Device (LED) can include a p-type nitride layer and a metal ohmic contact, thereon, where the metal ohmic contact has an average thickness of less than about 25 Å and a specific contact resistivity less than about $10^{-3}$ ohm-$cm^2$. The metal ohmic contact can comprise Pt.

In some embodiments according to the invention, the metal ohmic contact has an average thickness less than about 20 Å. In some embodiments according to the invention, the metal ohmic contact has an average thickness between about 13 Å and about 18 Å. In some embodiments according to the invention, the metal ohmic contact has an average thickness of about 15 Å. In some embodiments according to the invention, the metal ohmic contact has an average thickness less than about 10 Å.

In some embodiments according to the invention, the metal ohmic contact covers less than about 67% of the p-type nitride layer measured via an Auger analysis of the metal ohmic contact. In some embodiments according to the invention, the metal ohmic contact covers a portion of the p-type nitride layer and a remaining portion of the p-type nitride layer is un-covered by the metal ohmic contact.

In some embodiments according to the invention, the metal ohmic contact has an average thickness less than about 5 Å. In some embodiments according to the invention, the metal ohmic contact covers less than about 47% of the p-type nitride layer measured via an Auger analysis of the metal ohmic contact.

In some embodiments according to the invention, a normalized transmissivity of the metal ohmic contact is about 92% at a measurement wavelength of about 350 nm. In some embodiments according to the invention, the metal ohmic contact covers a portion of the p-type nitride layer and a remaining portion of the p-type nitride layer is un-covered by the metal ohmic contact.

In some embodiments according to the invention, the metal ohmic contact has an average thickness less than about 3 Å. In some embodiments according to the invention, the metal ohmic contact covers less than about 28% of the p-type nitride layer measured via an Auger analysis of the metal ohmic contact.

In some embodiments according to the invention, the normalized transmissivity of the metal ohmic contact is about 94% to about 96% at a measurement wavelength of about 350 nm. In some embodiments according to the invention, the metal ohmic contact has an average thickness of about 1 Å. In some embodiments according to the invention, the metal ohmic contact covers less than about 13% of the p-type nitride layer measured via an Auger analysis of the metal ohmic contact. In some embodiments according to the invention, a normalized transmissivity of the metal ohmic contact is more than about 98% at a measurement wavelength of about 350 nm.

In some embodiments according to the invention, the metal ohmic contact can be platinum, rhodium, zinc oxide, palladium, palladium oxide, titanium, nickel/gold, nickel oxide/gold, nickel oxide/platinum and/or titanium/gold. In some embodiments according to the invention, the LED can also include a bonding pad on the metal ohmic contact.

In some embodiments according to the invention, an LED can include a p-type nitride layer and a metal ohmic contact, thereon, where the metal ohmic contact has an average thickness of about 1 Å. In some embodiments according to the invention, and LED can include a p-type nitride layer and a metal ohmic contact thereon. The metal ohmic contact can have an average thickness of about 1 Å that covers about 13% of the p-type nitride layer measured via an Auger analysis of the metal ohmic contact.

In some embodiments according to the invention, an LED includes a p-type nitride layer and a metal ohmic contact thereon. The metal ohmic contact can have an average thickness sufficient to provide a normalized transmissivity of more than about 98% at a measurement wavelength of about 350 nm.

In some embodiments according to the invention, a method of forming a semiconductor based Light Emitting Device (LED) can be provided by forming a p-type nitride layer on an n-type substrate, forming a metal ohmic contact on the p-type nitride layer to an average thickness less than about 25 Å and a specific contact resistivity less than about $10^{-3}$ ohm-cm$^2$, and ceasing forming the metal ohmic contact.

In some embodiments according to the invention, foaming a metal ohmic contact can further include depositing metal on the p-type nitride layer and on a witness slide for a time interval at a rate to provide a metal layer having a first average thickness for the metal ohmic contact and an indication of thickness of the metal layer on the witness slide is monitored. Metal is further deposited for subsequent time interval(s) and/or subsequent rate(s) to increase the average thickness if the indication is above a predetermined indication threshold. Deposition of the metal is ceased if the indication is about equal to or below the predetermined indication threshold.

In some embodiments according to the invention, the monitoring of the indication of thickness is provided by measuring transmissivity, sheet resistivity, capacitance, reflectance, and/or resonant frequency of the metal layer. In some embodiments according to the invention, the metal is further deposited until the indication exceeds the predetermined indication threshold. In some embodiments according to the invention, the rate of deposition is about 0.1 Å to about 0.5 Å per second.

DESCRIPTION OF EMBODIMENTS ACCORDING TO THE INVENTION

Figure 1:
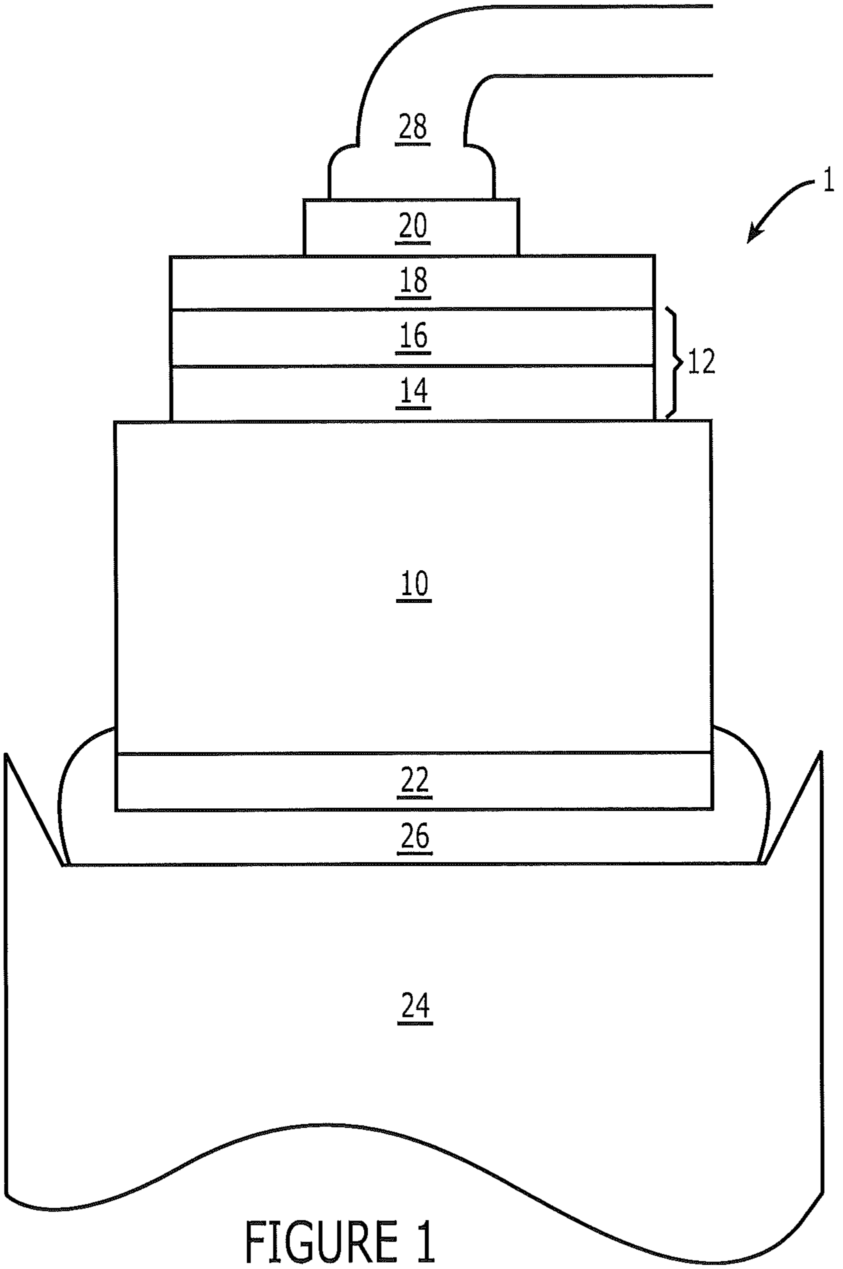
FIG. 1 is a cross-sectional drawing illustrating some embodiments of the invention.

The present invention now will be described more fully hereinafter with reference to the accompanying drawings, in which embodiments of the invention are shown. This invention should not be construed as limited to the embodiments set forth herein; rather, these embodiments are provided so that this disclosure will be thorough and complete, and will fully convey the scope of the invention to those skilled in the art. Like numbers refer to like elements throughout.

Furthermore, the various layers and regions illustrated in the figures are illustrated schematically. As will also be appreciated by those of skill in the art, while the present invention is described with respect to semiconductor wafers and diced chips, such chips may be diced into arbitrary sizes. Accordingly, the present invention is not limited to the relative size and spacing illustrated in the accompanying figures. In addition, certain features of the drawings such as layer thicknesses and feature sizes are illustrated in exaggerated dimensions for clarity of drawing and ease of explanation.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary tens "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein in connection with the thickness of ohmic contacts, the term "about" means within a tolerance of +/−1 Å.

Unless otherwise defined, all terms (including technical and scientific terms) used herein have the same meaning as commonly understood by one of ordinary skill in the art to which this invention belongs. It will be further understood that twins, such as those defined in commonly used dictionaries, should be interpreted as having a meaning that is consistent with their meaning in the context of the relevant art and this specification and will not be interpreted in an idealized or overly formal sense unless expressly so defined herein.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated as a rectangle will, typically, have rounded, curved or graded features at its edges rather than a discrete change from one region to the next. Thus, the regions illustrated in the figures are schematic in nature and their shapes are not intended to illustrate the precise shape of a region of a device and are not intended to limit the scope of the present invention.

Embodiments of the invention now will be described, generally with reference to gallium nitride-based light emitting diodes on silicon carbide-based substrates. However, it will be understood by those having skill in the art that many embodiments of the invention may be employed with many different combinations of substrate and epitaxial layers. For example, combinations can include AlGaInP diodes on GaP substrates; InGaAs diodes on GaAs substrates; AlGaAs diodes on GaAs substrates; SiC diodes on SiC or sapphire ($Al_2O_3$) substrates; and/or nitride-based diodes on gallium nitride, silicon carbide, aluminum nitride, sapphire, zinc oxide and/or other substrates.

GaN-based light emitting devices typically comprise an insulating, semiconducting or conductive substrate such as SiC or sapphire on which a plurality of GaN-based epitaxial layers are deposited. The epitaxial layers comprise an active region having a p-n junction that emits light when energized.

Although various embodiments of LEDs disclosed herein include a substrate, it will be understood by those skilled in the art that the crystalline epitaxial growth substrate on which the epitaxial layers comprising an LED are grown may be removed, and the freestanding epitaxial layers may be mounted on a substitute carrier substrate or submount which may have better thermal, electrical, structural and/or optical characteristics than the original substrate. The invention described herein is not limited to structures having crystalline epitaxial growth substrates and may be utilized in connection with structures in which the epitaxial layers have been removed from their original growth substrates and bonded to substitute carrier substrates.

Light emitting devices for use in embodiments of the present invention may be gallium nitride based light emitting diodes or lasers fabricated on a silicon carbide substrate such as those devices manufactured and sold by Cree, Inc. of Durham, N.C. For example, the present invention may be suitable for use with LEDs and/or lasers as described in U.S. Pat. Nos. 6,740,906, 6,734,033, 6,664,560, 6,201,262, 6,187,606, 6,120,600, 5,912,477, 5,739,554, 5,631,190, 5,604,135, 5,523,589, 5,416,342, 5,393,993, 5,338,944, 5,210,051, 5,027,168, 5,027,168, 4,966,862 and/or 4,918,497, the disclosures of which are incorporated herein by reference as if set forth fully herein. Other suitable LEDs and/or lasers are described in United States Patent Publication No. 2003/0006418, entitled "GROUP III NITRIDE BASED LIGHT EMITTING DIODE STRUCTURES WITH A QUANTUM WELL AND SUPERLATTICE, GROUP III NITRIDE BASED QUANTUM WELL STRUCTURES AND GROUP III NITRIDE BASED SUPERLATTICE STRUCTURES," and U.S. patent application Ser. No. 10/899,791, entitled "GROUP III NITRIDE BASED QUANTUM WELL LIGHT EMITTING DEVICE STRUCTURES WITH AN INDIUM CONTAINING CAPPING STRUCTURE," filed Jul. 27, 2004, U.S. patent application Ser. No. 10/881,814 entitled "LIGHT EMITTING DEVICES HAVING CURRENT BLOCKING STRUCTURES AND METHODS OF FABRICATING LIGHT EMITTING DEVICES HAVING CURRENT BLOCKING STRUCTURES," filed Jun. 30, 2004 and/or U.S. patent application Ser. No. 10/899,793 entitled "LIGHT EMITTING DEVICES HAVING A REFLECTIVE BOND PAD AND METHODS OF FABRICATING LIGHT EMITTING DEVICES HAVING A REFLECTIVE BOND PAD," filed Jul. 27, 2004, the disclosures of which are incorporated herein as if set forth fully.

In particular embodiments of the present invention, the light emitting devices may include a p-electrode that provides a reflecting layer to reflect light generated in the active region back through the device. Reflective p-electrodes and related structures are described in U.S. Patent Publication No. 2003/0123164 entitled "LIGHT EMITTING DIODES INCLUDING SUBSTRATE MODIFICATIONS FOR LIGHT EXTRACTION AND MANUFACTURING METHODS THEREFOR" and in U.S. Patent Publication No. 2003/0168663 entitled "REFLECTIVE OHMIC CONTACTS FOR SILICON CARBIDE INCLUDING A LAYER CONSISTING ESSENTIALLY OF NICKEL, METHODS OF FABRICATING SAME, AND LIGHT EMITTING DEVICES INCLUDING THE SAME," the disclosures of which are hereby incorporated by reference as if set forth fully herein.

As used herein the term "ohmic contact" refers to contacts where an impedance associated therewith is substantially given by the relationship of Impedance=V/I, where V is a voltage across the contact and I is the current, at substantially all expected operating frequencies (i.e., the impedance associated with the ohmic contact is substantially the same at all operating frequencies). For example, in some embodiments according to the invention, an ohmic contact can be a contact with a specific contact resistivity of less than about $10^{-03}$ ohm-cm$^2$ and, in some embodiments less than about $10^{-04}$ ohm-cm$^2$. Thus, a contact that is rectifying or that has a high specific contact resistivity, for example, a specific contact resistivity of greater than about $10^{-03}$ ohm-cm$^2$, is not an ohmic contact as that term is used herein.

An LED may be mounted substrate side down onto a submount such as a metal plate, printed circuit board or lead frame (all of which are referred to herein as a "submount"). FIG. 1 schematically illustrates an LED 1 having an n-type SiC substrate 10, an active region 12 comprising an n-GaN-based layer 14 and a p-GaN-based layer 16 grown on the substrate and patterned into a mesa. A metal p-electrode 18 is deposited on and electrically coupled to the p-GaN layer 16 and a wire bond connection 28 is made to a bond pad 20 on the p-electrode 18. An n-electrode 22 on and electrically coupled to the conductive substrate is attached to conductive submount 24 using a conductive epoxy 26. The epoxy 26 is heat cured which causes it to harden, providing a stable and electrically conductive mount for the LED chip. Light generated in the active region 12 is directed up and out of the device. However, a portion of the generated light may be absorbed by the ohmic p-electrode 18 (sometimes referred to herein as the ohmic contact 18).

In order to reduce and/or minimize absorption of light by the p-electrode 18, the thickness of the p-electrode can be reduced below 25 Å in accordance with some embodiments of the present invention. Some embodiments of the present invention provide an ultrathin p-contact metal that may be deposited in a way that is reproducible, controllable, and manufacturable. In some embodiments, the ohmic contact 18 comprises platinum. Other materials may be used for the ohmic contact 18. For example, the ohmic contact 18 may comprise rhodium, zinc oxide, palladium, palladium oxide, titanium, nickel/gold, nickel oxide/gold, nickel oxide/platinum and/or titanium/gold, In some embodiments, the ohmic contact 18 has an average thickness less than 25 Å. In further embodiments, the ohmic contact 18 has an average thickness less than 20 Å. In some embodiments, the ohmic contact 18 may have an average thickness between 13 and 18 Å. In further embodiments, the ohmic contact 18 may have an average thickness of about 15 Å+/−1 Å. In some embodiments, the ohmic contact 18 has an average thickness less than 10 Å. In some embodiments, the ohmic contact 18 has an average thickness less than 5 Å, and in further embodiments, the ohmic contact 18 has an average thickness less than 3 Å. In still further embodiments, the ohmic contact has an average thickness of about 1 Å.

It will be understood by those skilled in the art that film thicknesses less than 10 Å, and in particular film thicknesses less than 5 Å, may represent partial or sub-monolayer coverage of the surface. Thus, even though the resulting layer is referred to as a "film", the film may only partially cover the surface of the p-type GaN layer. Furthermore, some of uncovered portions of the p-type GaN layer can be characterized as "exposed" as those portions are not covered by a film thicker than the minimum average thickness of the metal ohmic contact (e.g., the exposed portions are covered by a sub-monolayer of the metal ohmic contact).

Thus, some embodiments of the present invention provide a contact layer with coverage of less than 70%. Further embodiments of the present invention provide a contact layer with coverage of less than 50%. Still further embodiments of the present invention provide a contact layer with coverage of less than 30%. Additional embodiments of the present invention provide a contact layer with coverage of less than 20%. As used herein, when the metal ohmic contact is described as covering "only" a particular percentage of the p-type nitride layer (e.g., 70%) it will be understood that the remaining portion (e.g., 30%) of the p-type nitride layer can be un covered (i.e., exposed) or covered by portions of the metal ohmic contact which are less than the average thickness of the metal ohmic contact covering the p-type nitride layer. Furthermore, these percentages of coverage are not to be interpreted to include portions of the p-type nitride which are not beneath the outer edges of the metal ohmic contact (e.g, such as an oversized p-type nitride layer).

Ohmic contacts according to some embodiments of the present invention may be formed by electron beam (e-beam) evaporation or any other suitable techniques for controllably forming atomically thin metallic films. For example, it may be possible to form the ohmic contacts by electroplating provided adequate process control is maintained. In electron beam evaporation, a metal source target is heated in a vacuum chamber to the point of vaporization by a high intensity electron beam which melts a region of the target. An epitaxial wafer placed within the chamber is controllably coated with vaporized metal. E-beam evaporation and other film deposition methods are described in Chapter 6 of INTRODUCTION TO MICROELECTRONIC FABRICATION by R. Jaeger (2nd Ed. 2002).

The deposition rate of the process may be controlled by changing the current and energy of the electron beam. In some embodiments, the deposition rate is maintained at a low rate, e.g. in the range of 0.1-0.5 Å per second in order to maintain adequate control of film thickness. In addition, the film deposition may be controlled during deposition by monitoring the transmission properties of a witness slide on which the ohmic metal film is simultaneously deposited. The witness slide may be sapphire, quartz, or any other optically transmissive material on which a metal film may be deposited. The transmission sensitivity to the metal thickness is dependent upon the wavelength of the light used in the monitoring process. Namely, the transmission sensitivity may be enhanced at shorter wavelengths. Accordingly, in some embodiments, the transmission properties of a sapphire witness slide are measured during or after film deposition by means of a monitoring system employing a UV source capable of emitting light at wavelengths of 350 nm or less, such as a UV spectrophotometer. The slow deposition rate may allow for reproducible and controllable deposition of the thin layer.

The ohmic contact 18 may have a thickness range of 1-25 Å. For platinum contacts to flip-chip devices, the preferred thickness is 1-5 Å. Flip-chip devices typically include additional metal layers blanket deposited on the ohmic contact. For example, there may be a reflector layer 30 illustrated in FIG. 3, as well as barrier, bonding, and/or adhesion layers which form metal stack 32. Accordingly, current spreading may occur in the reflector layer 30 and/or metal stack 32. For platinum contacts to non-flip-chip devices, the preferred thickness is 13-18 Å, and a bond pad including metal current spreading fingers is formed on the ohmic contact 18.

Once deposited, the ohmic contact 18 provides an ohmic or non-rectifying contact "as deposited." That is, no further processing or annealing may be required in order to provide a quasi-ideal electrical contact to the p-type GaN layer 16. However, in some cases it may be necessary or desirable to anneal the ohmic contact 18 or perform other post-deposition processing in order to improve its ohmic characteristics (such as to reduce the specific contact resistance of the contact layer, for example).

In some embodiments, methods according to the present invention include forming an n-type epitaxial layer on a substrate, forming a p-type epitaxial layer on the n-type epitaxial layer to thereby provide a device precursor structure, placing the device precursor structure in an e-beam evaporation system, placing a witness slide in the evaporation system, and forming a layer of platinum on the device precursor structure and the witness slide while simultaneously monitoring the transmissivity of the metal film on the witness slide. In some embodiments, deposition of the ohmic contact metal may be halted before the normalized transmissivity of the metal film on the witness slide falls below 98% at a measurement wavelength of 350 nm. In other embodiments, deposition of the ohmic contact metal may be halted before the normalized transmissivity of the metal film on the witness slide falls below 96% at a measurement wavelength of 350 nm. In further embodiments, deposition of the ohmic contact metal may be halted before the normalized transmissivity of the metal film on the witness slide falls below 92% at a measurement wavelength of 350 nm.

Figure 5:
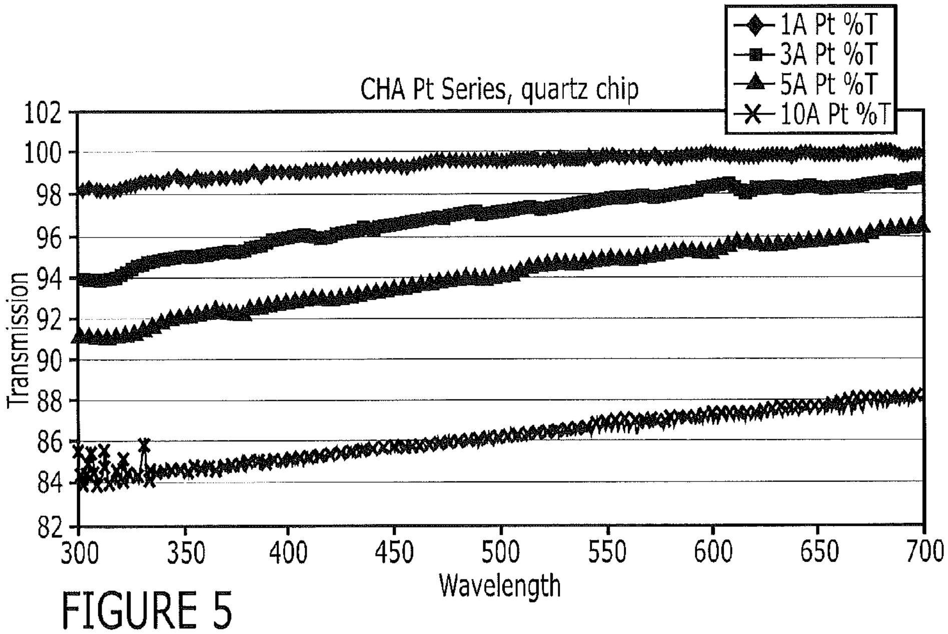
FIG. 5 is a graph of the transmissivity of platinum films of various thicknesses as measured over a range of wavelengths.

As illustrated in FIG. 5, the normalized transmissivity of a metal film deposited on a witness slide varies depending on the thickness of the film and the wavelength of light used in the measurement. Stated differently, the absorptivity of the metal film is a function of both the film thickness and the wavelength of light passing through the film. As is apparent from the graph of FIG. 5, the greatest variation in absorptivity as a function of thickness occurs at lower wavelengths. For example, at a wavelength of 350 nm, a 1 Å platinum film exhibits a transmissivity of between 98 and 100%, while a film having an average thickness of 3 Å exhibits a transmissivity of between 94 and 96%, and a film having an average thickness of 5 Å exhibits a transmissivity of about 92%. The effect is even more pronounced at lower wavelengths.

Accordingly, in some embodiments, the transmission properties of a sapphire witness slide are monitored during film deposition by means of a monitoring system employing a UV source capable of emitting light at wavelengths of 350 nm or less. By monitoring in situ the transmissivity of a metal film formed on a calibrated witness slide, the deposition process may be halted before or after the transmissivity of the metal film reaches a predetermined threshold level. Accordingly, the deposition of extremely thin metal films may be controlled with a high degree of precision according to embodiments of the invention.

In some embodiments, deposition of the ohmic contact may be halted before the normalized transmissivity of the metal film on the witness slide falls below 98% at a measurement wavelength of 350 nm. In other embodiments, deposition of the ohmic contact may be halted before the normalized transmissivity of the metal film on the witness slide falls below 96% at a measurement wavelength of 350 nm. In further embodiments, deposition of the ohmic contact may be halted before the normalized transmissivity of the metal film on the witness slide falls below 92% at a measurement wavelength of 350 nm.

Other methods of monitoring the thickness of the deposited metal film may be employed. For example, other physical, electrical or optical characteristics of the film (or the material on which the film is deposited) which vary according to film thickness may be measured and compared against known standards to determine film thickness. Such characteristics may include, but are not limited to, sheet resistivity, capacitance, or reflectance of the film. In one embodiment, the resonant frequency of a quartz crystal coated with the evaporating material during deposition is monitored. The resonant frequency of the crystal shifts in proportion to the thickness of the deposited film and may provide a sufficiently accurate measure of film thickness. See Chapter 6 of INTRODUCTION TO MICROELECTRONIC FABRICATION by R. Jaeger (2nd Ed. 2002).

Figure 2A:
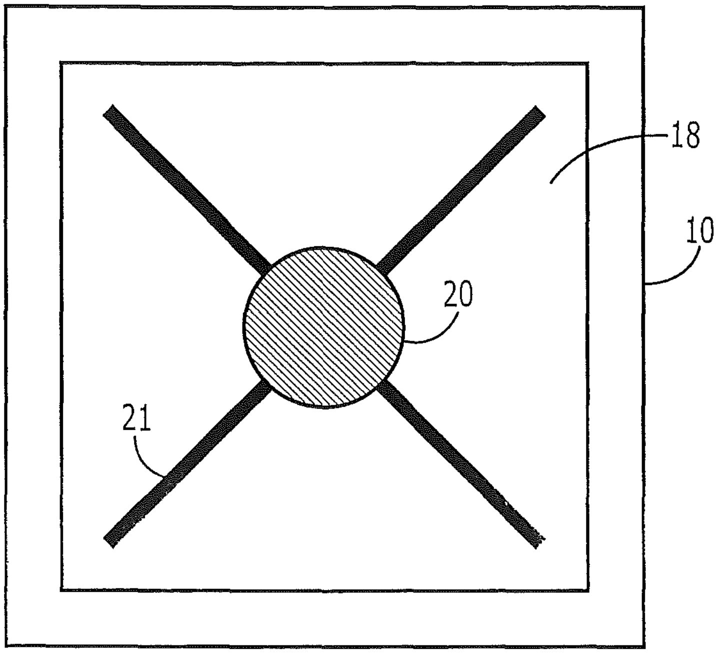
FIGS. 2A and 2B are top views of LED dice having ohmic contacts in accordance with some embodiments of the invention.
Figure 2B:
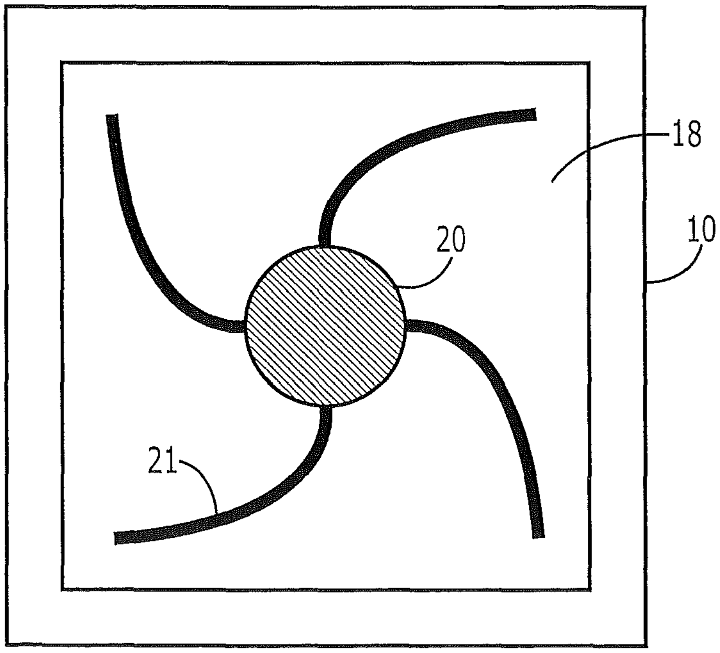

In order to facilitate current spreading, the bond pad may include one or more current spreading fingers extending across portions of the ohmic contact. As illustrated in FIGS. 2A and 2B, the bond pad 20 formed on the ohmic contact 18 may include one or more current spreading fingers 21 which extend from the bond pad 20 across portions of the ohmic contact 18. The current spreading fingers 21 may be straight as illustrated in FIG. 2A or curved as shown in FIG. 2B. Other configurations are possible. Although the embodiments illustrated in FIGS. 2A and 2B include four fingers 21 each, a greater or smaller number of fingers 21 may be used depending on the amount of current spreading desired.

Figure 3:
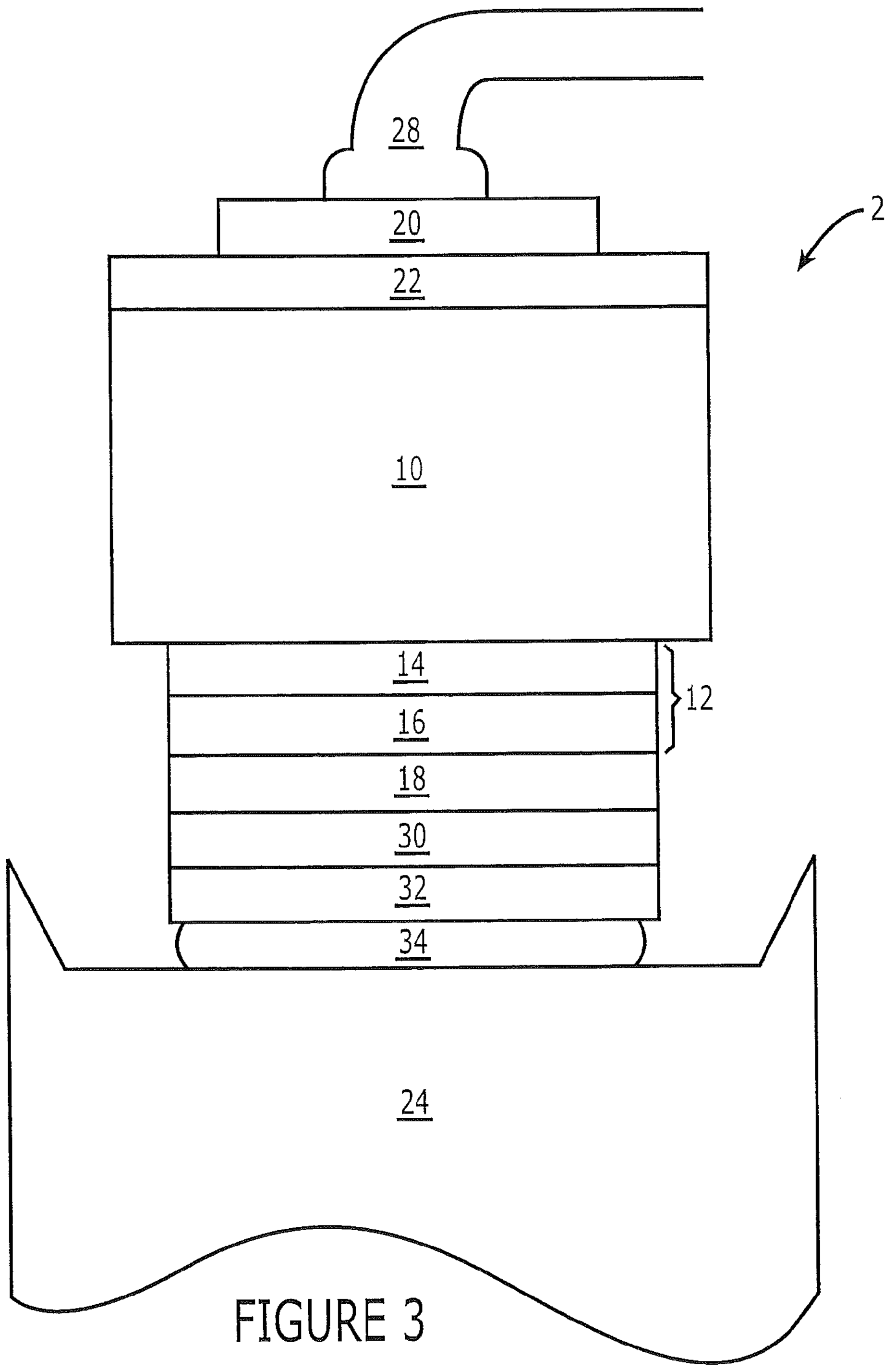
FIG. 3 is a cross-sectional drawing illustrating further embodiments of the invention.

FIG. 3 illustrates other LEDs according to some embodiments of the invention in which the LED is designed to be flip-chip mounted (i.e. mounted substrate side up). FIG. 3 schematically illustrates an LED 2 having an n-type SiC substrate 10, an active region 12 comprising an n-GaN-based layer 14 and a p-GaN-based layer 16 grown on the substrate and patterned into a mesa. A metal p-electrode 18 is deposited on and electrically coupled to the p-GaN layer 16 and a wire bond connection 28 is made to a bond pad 20 on the p-electrode 18. An n-electrode 22 on and electrically coupled to the conductive substrate 10 includes a bond pad 20 to which a wire bond connection 28 is made. In the embodiment of FIG. 3, the LED further includes a reflector 30. A metal stack 32 such as the metal stacks described in the above-referenced U.S. Pat. No. 6,740,906 is formed on reflector 30 to provide barrier, adhesion and/or bonding layers for example. The entire device is then mounted on a submount 24 by means of solder 34.

In order to reduce or minimize absorption of light by the p-electrode 18 so that more light can be reflected by reflector 30, the thickness of the p-electrode is reduced below 25 Å in accordance with the invention. In some embodiments, the p-electrode 18 comprises platinum. Other materials may be used for the ohmic contact 18. For example, the ohmic contact 18 may comprise rhodium, zinc oxide, palladium, palladium oxide, titanium, nickel/gold, nickel oxide/gold, nickel oxide/platinum and/or titanium/gold. In some embodiments, the ohmic contact 18 has an average thickness less than 25 Å. In further embodiments, the ohmic contact 18 has an average thickness less than 20 Å. In some embodiments, the ohmic contact 18 may have an average thickness between 13 and 18 Å. In further embodiments, the ohmic contact 18 may have an average thickness of about 15 Å. In some embodiments, the ohmic contact 18 has an average thickness less than 10 Å. In some embodiments, the ohmic contact 18 has an average thickness less than 5 Å, and in further embodiments, the ohmic contact 18 has an average thickness less than 3 Å. In still further embodiments, the ohmic contact 18 has an average thickness of about 1 Å. In some embodiments, the ohmic contact 18 has an average thickness less than 10 Å and a coverage of less than about 70%. In some embodiments, the ohmic contact 18 has an average thickness less than 5 Å and a coverage of less than about 50% and in further embodiments, the ohmic contact 18 has an average thickness less than 3 Å and a coverage of less than about 30% In still further embodiments, the ohmic contact 18 has an average thickness of about 1 Å and a coverage of less than about 15%.

The reflector 30 preferably is thicker than about 300 Å and preferably comprises aluminum and/or silver. Embodiments of FIG. 3 can provide improved current spreading, since the reflector 30 contacts the thin transparent ohmic contact 18 over the entire surface area of the thin transparent ohmic contact 18. Thus, current need not travel horizontally through the ohmic contact 18, as may be the case in other embodiments. Current spreading thus may be enhanced in this embodiment. Other contact structures may be used, for example, those described in detail in U.S. Pat. No. 6,740,906. As discussed above, highly reflective materials such as Al and Ag may make poor ohmic contacts to p-type GaN. Although the phenomenon has not been fully investigated, it is believed that providing an ultrathin layer of platinum between a p-type GaN layer and a silver reflector may reduce the work function of the silver at the interface sufficient to allow formation of a satisfactory ohmic contact between the reflector and the p-type GaN while maintaining a high degree of reflectivity.

Embodiments of the invention may reduce the optical losses in the LEDs that result from absorption in the p-contact metal. The p-contact metal may be required to make an ohmic contact with a minimal voltage drop, but typically the contact metal introduces optical losses. Embodiments of the present invention may provide a contact with low optical loss, low contact resistance, and good metal-semiconductor adhesion suitable for high brightness nitride LEDs that employ either reflective or transparent p-side metal stacks. By reducing the p-contact metal to an extremely thin layer (e.g. 1.5 vs 25 Å of Pt), light output of a device may be increased substantially. For example, an improvement in light output of approximately 10% was achieved in a 300×300 μm square chip and an improvement of approximately 20% was achieved in a 900×900 μm square chip. The increased brightness levels may speed the introduction of solid state lighting sources into products for general illumination and other specialty illumination applications, such as automotive headlamps.

Figure 4:
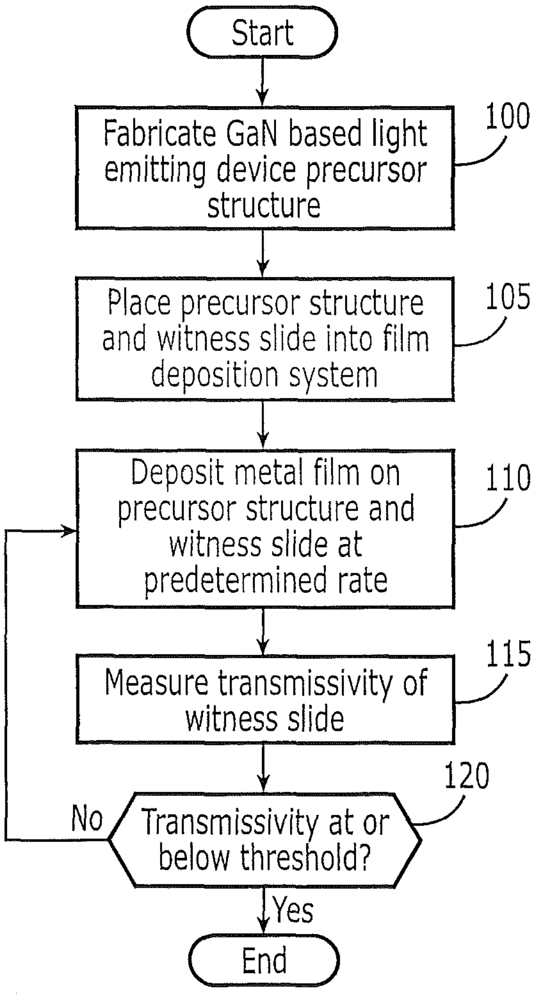
FIG. 4 is a flowchart illustrating method embodiments of the invention.

FIG. 4 illustrates method embodiments of the invention. As illustrated in FIG. 4, method embodiments may include fabricating a GaN based light emitting device precursor structure in step 100. The step of fabricating a GaN based light emitting device precursor structure may include forming an n-type epitaxial layer on a substrate and forming a p-type epitaxial layer on the n-type epitaxial layer. In step 105, the method includes placing the device precursor structure and a witness slide in metal film deposition system such as an e-beam evaporation system. Continuing with step 110, the method includes depositing a metal film on the device precursor structure and the witness slide. The transmissivity of the metal film on the witness slide is measured in step 115. If the transmissivity of the film reaches or falls below a predefined threshold (decision block 120), the process is halted. Otherwise, metal film deposition is continued (step 110).

In some embodiments, deposition of the ohmic contact metal may be halted before the normalized transmissivity of the metal film on the witness slide falls below 98% at a measurement wavelength of 350 nm. In other embodiments, deposition of the ohmic contact metal may be halted before the normalized transmissivity of the metal film on the witness slide falls below 96% at a measurement wavelength of 350 nm. In further embodiments, deposition of the ohmic contact metal may be halted before the normalized transmissivity of the metal film on the witness slide falls below 92% at a measurement wavelength of 350 nm.

Some embodiments of the invention include fabricating a GaN based LED precursor structure, placing the precursor structure along with a test substrate such as a witness slide into a metal film deposition system, depositing a metal film on the precursor structure and the test substrate for a predetermined time at a predetermined deposition rate, and measuring the transmissivity of the film on the test substrate. If the transmissivity of the film is below a predetermined threshold (indicating that the metal film is too thick), the metal film is removed from the precursor structure, the precursor is placed back into the film deposition system, and a metal film is deposited on the precursor structure for a second predetermined time and/or deposition rate. The process may be repeated any number of times until an acceptable thickness has been deposited.

Figure 6:
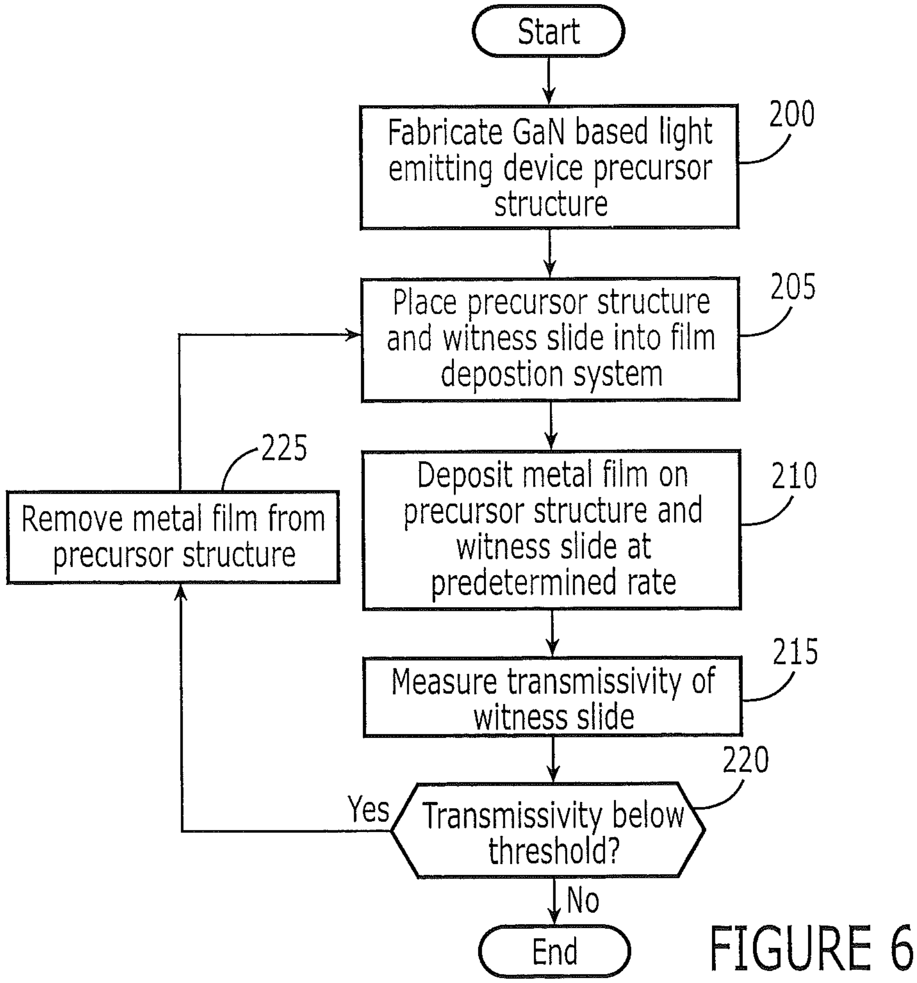
FIG. 6 is a flowchart illustrating further method embodiments of the invention.

As illustrated in FIG. 6, some embodiments of the invention include the steps of fabricating a GaN based LED precursor structure (step 200). The precursor structure is placed into a film deposition system along with a witness slide or other test substrate (step 205). A metal film is then deposited on the precursor structure and the witness slide (step 210). The thickness of the film on the witness slide is then measured (step 215) for example by measuring the transmissivity of the film. If the transmissivity is below a predetermined threshold (indicating that the film is too thick) (step 220), then the metal film may be removed from the structure (for example by etching) and the precursor structure is placed back into the film deposition system.

Figure 7:
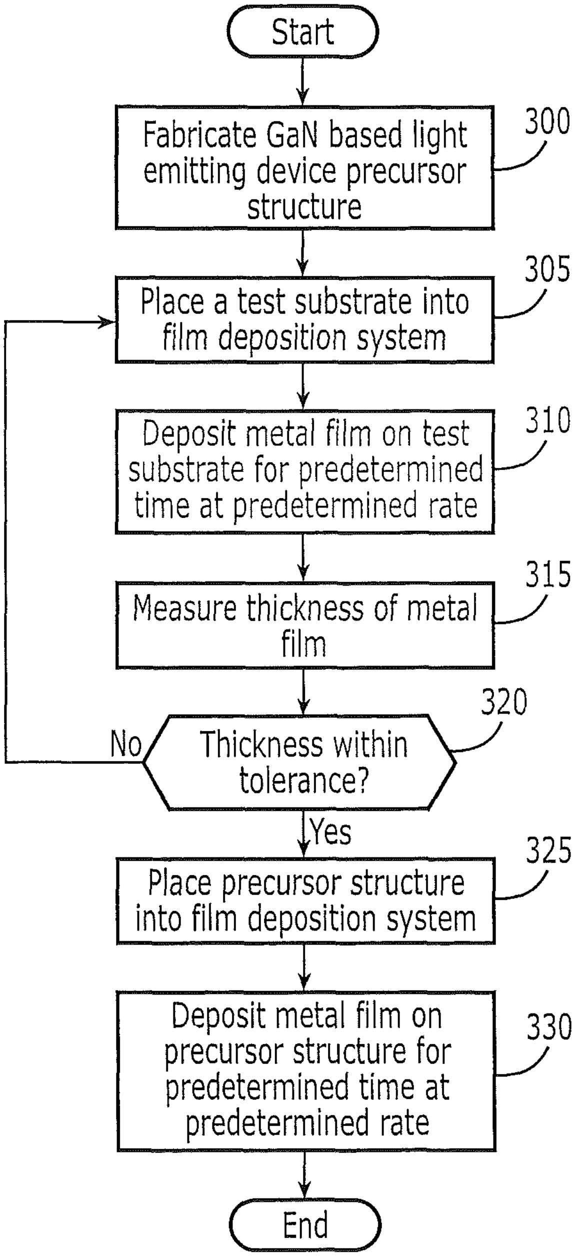
FIG. 7 is a flowchart illustrating further method embodiments of the invention.

In other embodiments illustrated in FIG. 7, the film thickness may be controlled by performing calibrating runs on test materials within the deposition system to determine the appropriate duration and rate of the deposition step. Accordingly, some embodiments of the invention include fabricating a GaN based LED precursor structure (step 300) placing a test substrate into a film deposition system (step 305), depositing a metal film on the test substrate for a predetermined time at a predetermined deposition rate (step 310), and measuring the thickness of the resulting film (step 315). If the film thickness falls within a predetermined desired range (step 320), a GaN based LED precursor structure is placed into the film deposition system (step 325) and a metal film is deposited on the precursor structure for the predetermined time and rate (step 330). If the film thickness is not within the predetermined range, then a second test substrate (or a reconditioned first test substrate) may be placed into the film deposition system (step 305) and a second film is deposited on the second test substrate for a second predetermined time and/or rate.

Figure 8:
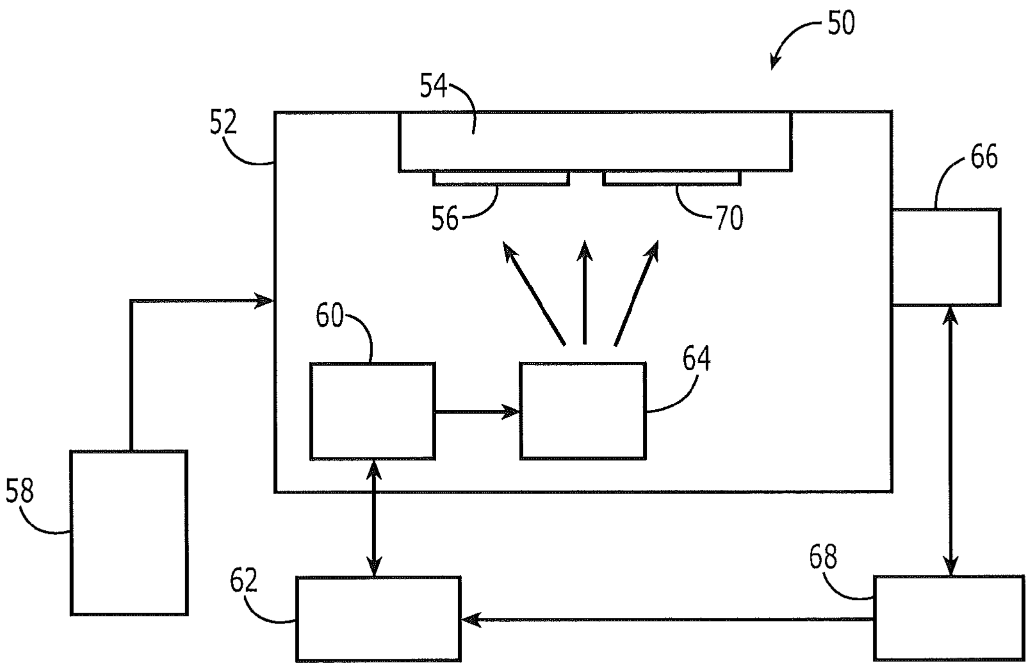
FIG. 8 is a schematic diagram of a film deposition system in accordance with some embodiments of the invention.

In further embodiments, the monitoring system may provide a signal output to the film deposition system when the film thickness reaches a threshold level. The film deposition system may stop the deposition process in response to the signal output from the monitoring system to provide automatic closed-loop control of the deposition process. FIG. 8 is a schematic diagram of a film deposition system 50 in accordance with embodiments of the invention. System 50 includes a vacuum chamber 52 in which a wafer carrier 54 is mounted. Wafer 56, on which the metal film will be deposited, is mounted on wafer carrier 54 along with a witness slide or test structure 70. Vacuum pump system 58 is coupled to the vacuum chamber 52 for pumping gas out of the chamber. Vacuum pump system 58 may comprise multiple pumps and gauges (not shown) to reduce the pressure inside vacuum chamber 52 to less than $10^{-3}$ Pa.

An e-beam generator 60 within the vacuum chamber generates a beam of electrons at a predetermined energy and directs the beam toward source target 64. E-beam generator 60 is controlled by e-beam controller 62. When the electron beam generated by e-beam generator 60 strikes the source target 64, source material evaporates from source target 64 and redeposits on wafer 56 and witness slide 70. A sensor 66 which may be mounted inside or outside the vacuum chamber measures the thickness of the deposited film by monitoring physical, electrical or optical characteristics of the witness slide which vary according to film thickness may be measured and compared against known standards to determine film thickness. As discussed above, such characteristics may include transmissivity, reflectivity, conductivity, resonant frequency or other characteristics. Sensor 66 is controlled by sensor controller 68 (which may in practical applications be the same as e-beam controller 62). When sensor 66 detects that the deposited film thickness has reached a predetermined threshold, the monitoring system may provide a signal output to the e-beam controller 62, causing the e-beam controller to stop the deposition process. Accordingly, a system 50 in accordance with embodiments of the invention may provide automatic closed-loop control of the deposition process.

Figure 9A:
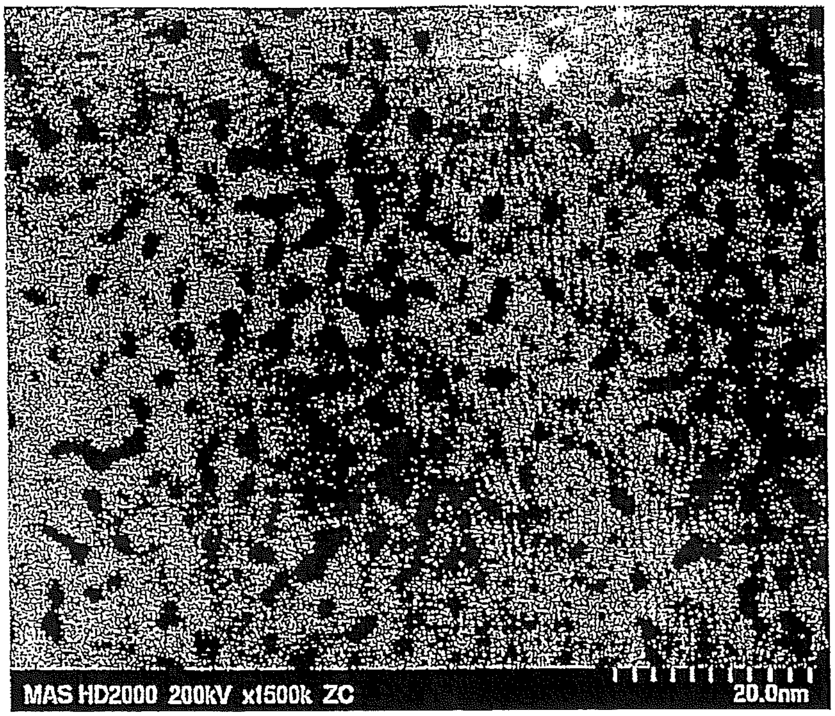
FIGS. 9A and 9B are scanning transmission electron microscope (STEM) images of a Pt contact layer having an average thickness of about 10 Å according to some embodiments of the present invention.
Figure 9B:
Figure 10A:
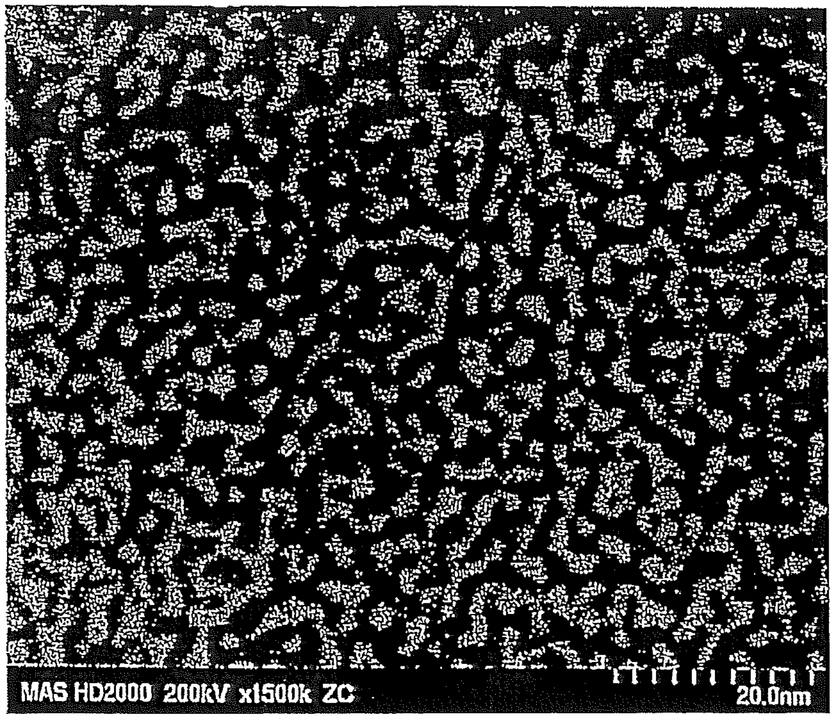
FIGS. 10A and 10B are STEM images of a Pt contact layer having an average thickness of about 3 Å according to some embodiments of the present invention.
Figure 10B:
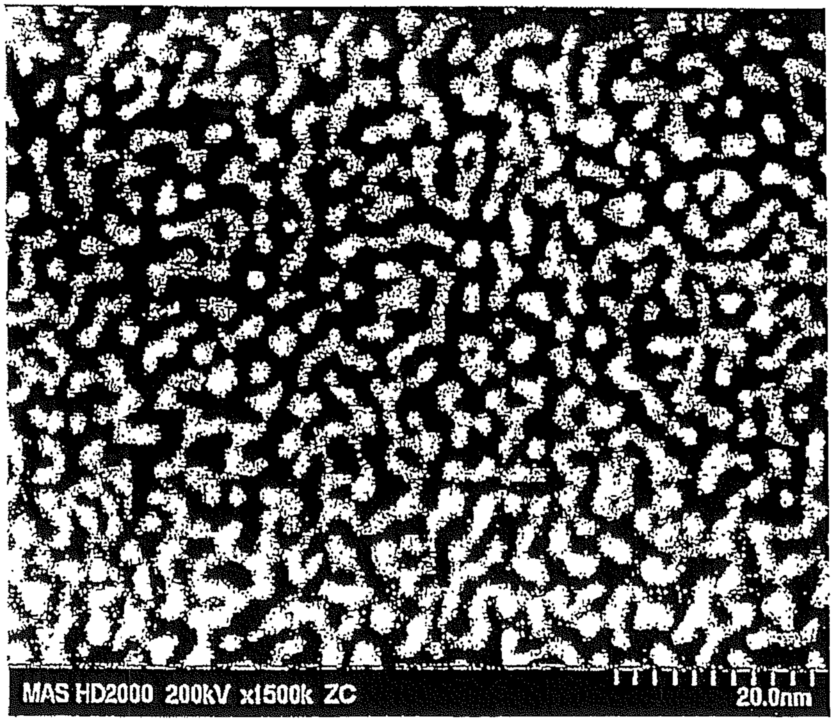
Figure 11A:
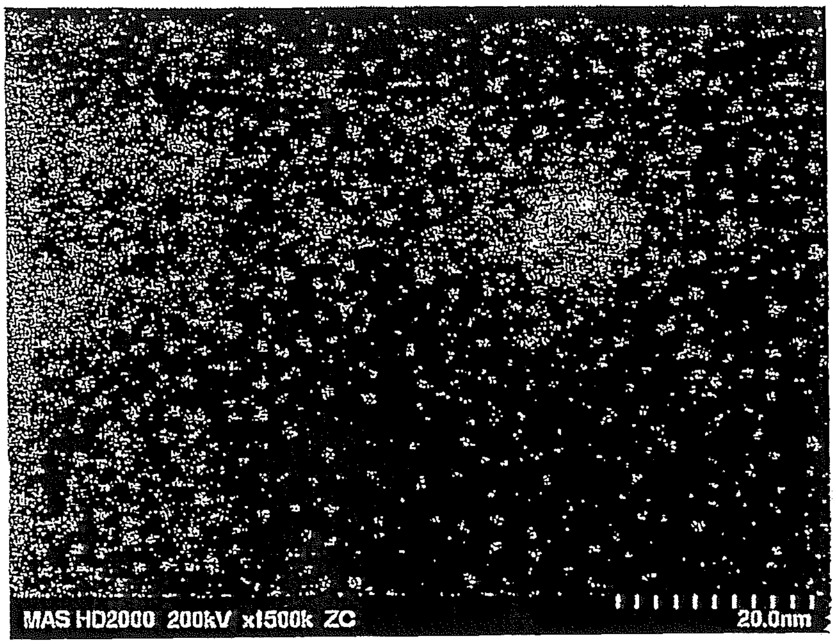
FIGS. 11A and 11B are STEM images of a Pt contact layer having an average thickness of about 1 Å according to some embodiments of the present invention.
Figure 11B:
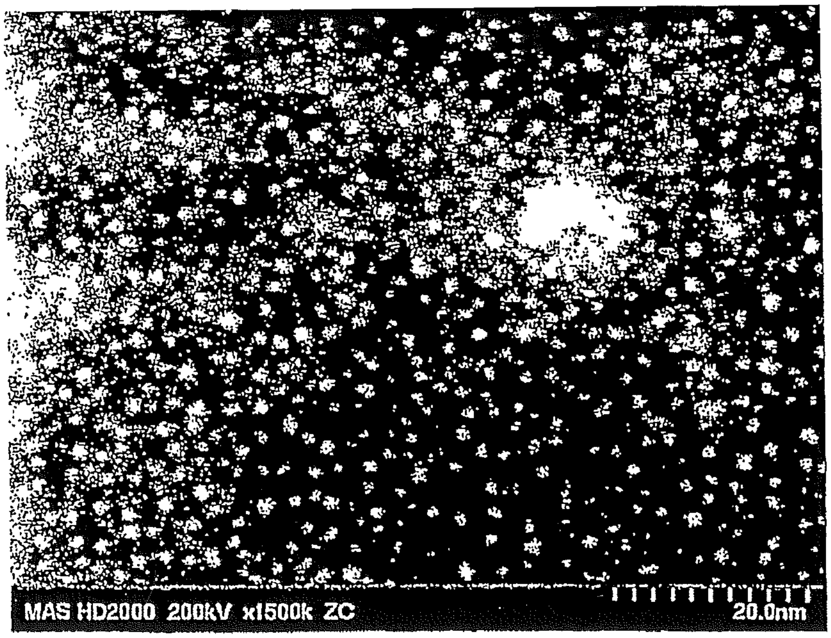

Contact layers were fabricated as described above at thicknesses of 25 Å, 10 Å, 3 Å and 1 Å. The contact layers were Pt. The 25 Å layer was assumed to be a continuous layer of Pt. STEM images were obtained for the 10 Å, 3 Å and 1 Å layers. The STEM images are shown in FIGS. 9A, 10A and 11A. The STEM images show a distinct change in the amount of Pt from 10 Å (FIG. 9A) (>>50% coverage) to 1 Å (FIG. 11A) (<<50% coverage). In an attempt to quantify the amount of Pt, a threshold technique that removes the gray scale such that a pixel value above a certain value is assigned pure white (Pt) and a pixel value below a certain value gets assigned pure black was applied to the STEM images. The images after thresholding are seen in FIGS. 9B, 10B and 11B. While the selection of the threshold value may be subjective, comparing the thresholded image to the original, the fit appears to be consistent. By taking the ratio of black (no Pt) to white (Pt) an indication of coverage may be obtained. Table 1 below shows the analysis of the STEM images in FIGS. 9B, 10B and 11B.

TABLE1

| STEM Analysis | | |
|---|---|---|
| Sample | 1500 kX B/W Ratio | Approximate Pt Coverage |
| 10 Å | 0.6406 | 0.61 |
| 3 Å | 1.9924 | 0.33 |
| 1 Å | 11 | 0.08 |

Auger surface analysis was also performed on the Pt layers. The results of the Auger surface analysis is shown in Table 2.

TABLE 2

| Auger Analysis | | | | | | | |
|---|---|---|---|---|---|---|---|
| Auger Analysis | | | | | | | Pt Coverage |
| Sample | % Pt | % Ga | % N | % C | % O | % Cl | XÅ/25 Å |
| 1 Å | 7.7 | 34.3 | 19.1 | 30.6 | 7.1 | 1.3 | 0.13 |
| 3 Å | 16.3 | 27.7 | 14.4 | 33.9 | 6.7 | 1.1 | 0.28 |
| 5 Å | 27.3 | 21.0 | 10.6 | 34.5 | 5.4 | 1.2 | 0.47 |
| 10 Å | 39.4 | 14.2 | 3.8 | 36.9 | 5.4 | 0.2 | 0.67 |
| 25 Å | 58.7 | 2.0 | 2.3 | 33.0 | 3.7 | 0.3 | 1 |

As is seen in Table 2, assuming that the 25 Å layer is a continuous layer, then by Auger analysis, the 10 Å layer has about 67% coverage, the 5 Å layer has about 47% coverage, the 3 Å layer has about 28% coverage and the 1 Å layer has about 13% coverage. Accordingly, in some embodiments according to the present invention, the average thickness of the metal ohmic contact is related to the % of the p-type nitride layer covered by the metal ohmic contact.

Many alterations and modifications may be made by those having ordinary skill in the art, given the benefit of the present disclosure, without departing from the spirit and scope of the invention. Therefore, it must be understood that the illustrated embodiments have been set forth only for the purposes of example, and that it should not be taken as limiting the invention as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the invention.

What is claimed:

1. A flip-chip semiconductor based Light Emitting Device (LED) comprising:
- an n-type GaN epi-layer on a substrate;
- a p-type GaN epi-layer on the n-type GaN epi-layer;
- a metal ohmic contact on the p-type GaN epi-layer, the metal ohmic contact comprising an average thickness less than about 5 Å and a specific contact resistivity less than about $10^{-3}$ ohm-cm$^2$;
- a reflector on the metal ohmic contact; and
- a metal stack on the reflector.

2. An LED according to claim 1 wherein the metal ohmic contact covers less than about 67% of the p-type GaN epi-layer.

3. An LED according to claim 1 wherein the metal ohmic contact covers less than about 47% of the p-type GaN epi-layer.

4. An LED according to claim 1 wherein the metal ohmic contact comprises an average thickness less than about 3 Å.

5. An LED according to claim 4 wherein the metal ohmic contact covers less than about 28% of the p-type GaN epi-layer.

6. An LED according to claim 1 wherein the metal ohmic contact comprises an average thickness of about 1 Å.

7. An LED according to claim 6 wherein the metal ohmic contact covers less than about 13% of the p-type GaN layer.

8. An LED according to claim 1 wherein the reflector comprises a thickness greater than about 300 Å.

9. An LED according to claim 8 wherein the reflector comprises aluminum and/or silver.

10. A flip chip semiconductor based LED comprising:
- a p-type nitride layer;
- a metal ohmic contact on the p-type nitride layer, the metal ohmic contact comprising an average thickness of less than about 5 Å and a specific contact resistivity less than about $10^{-3}$ ohm-cm$^2$; and
- a reflector on the metal ohmic contact.

11. An LED according to claim 2 wherein the metal ohmic contact comprises a discontinuous layer on the p-type GaN epi-layer.

12. An LED according to claim 10 wherein the metal ohmic contact covers less than about 67% of the p-type nitride layer.

13. An LED according to claim 12 wherein the metal ohmic contact comprises a discontinuous layer on the p-type nitride layer.

14. An LED according to claim 10 wherein the metal ohmic contact comprises an average thickness less than about 3 Å.

15. A flip chip semiconductor based LED comprising:
- a p-type nitride layer;
- a metal ohmic contact on the p-type nitride layer, the metal ohmic contact comprising an average thickness of less than about 10 Å wherein the metal ohmic contact covers less than about 67% of the p-type nitride layer and wherein the metal ohmic contact comprises a discontinuous layer on the p-type nitride layer; and a reflector on the metal ohmic contact.

16. A flip-chip semiconductor based Light Emitting Device (LED) comprising:

an n-type GaN epi-layer on a substrate;

a p-type GaN epi-layer on the n-type GaN epi-layer;

a metal ohmic contact on the p-type GaN epi-layer, the metal ohmic contact comprising an average thickness less than about 10 Å, wherein the metal ohmic contact covers less than about 67% of the p-type GaN epi-layer and wherein the metal ohmic contact comprises a discontinuous layer on the p-type GaN epi-layer;

a reflector on the metal ohmic contact; and a metal stack on the reflector.

* * * * *